United States Patent [19]
Watt

[11] Patent Number: 5,701,024
[45] Date of Patent: Dec. 23, 1997

[54] ELECTROSTATIC DISCHARGE (ESD) PROTECTION STRUCTURE FOR HIGH VOLTAGE PINS

[75] Inventor: Jeffrey Watt, Mountain View, Calif.

[73] Assignee: Cypress Semiconductor Corp., San Jose, Calif.

[21] Appl. No.: 539,645

[22] Filed: Oct. 5, 1995

[51] Int. Cl.$^6$ .................................................. H01L 23/62
[52] U.S. Cl. ........................... 257/360; 257/392; 361/91
[58] Field of Search ................................ 257/360, 379, 257/392, 401; 361/91

[56] References Cited

U.S. PATENT DOCUMENTS

| | | | |
|---|---|---|---|
| 4,990,802 | 2/1991 | Smooha | 307/482.1 |
| 5,019,888 | 5/1991 | Scott et al. | 357/41 |
| 5,043,782 | 8/1991 | Avery | 357/23.13 |
| 5,140,401 | 8/1992 | Ker et al. | 357/43 |
| 5,182,220 | 1/1993 | Ker et al. | 437/34 |
| 5,218,222 | 6/1993 | Roberts | 257/362 |
| 5,289,334 | 2/1994 | Ker et al. | 361/56 |
| 5,329,143 | 7/1994 | Chan et al. | 257/173 |
| 5,371,395 | 12/1994 | Hawkins | 257/360 |

OTHER PUBLICATIONS

IEEE Transactions on Electron Devices, vol. 35, No. 12, Dec. 1988; "Internal Chip ESD Phenomena Beyond the Protection Circuit"; Duvvury, et al.; pp. 2133–2138.

EOS/ESD Symposium Proceedings (1989); "Improving the ESD Failure Threshold of Silicided nMOS output Transistors by Ensuring Uniform Current Flow"; Polgreen, et al.; pp. 168–174.

IEEE Electron Device Letters, vol. 12, No. 1; Jan. 1991; "A Low–Voltage Triggering SCR for On–Chip ESD Protection at Output and Input Pads"; Chatterjee; pp. 21–22.

IEEE (1992); "Achieving Uniform nMOS Device Power Distribution for Sub–Micron ESD Reliability"; Duvvury, et al.; pp. 92–131 –92–134.

EOS/ESD Symposium; "ESD Protection in a Mixed Voltage Interface and Multi–Rail Disconnected Power Grid Environment in 0.50–and 0.25–mu m Channel Length CMOS Technologies"; Voldman; pp. 94–125 –94–134.

(List continued on next page.)

*Primary Examiner*—Mark V. Prenty
*Attorney, Agent, or Firm*—Bliss McGlynn, P.C.

[57] ABSTRACT

An improved input ESD protection structure is disclosed that is suitable for use on high-voltage input pins, such as programming pins, of programmable integrated circuits such as programmable logic devices (PODs) programmable read-only memories (PROMs), or field programmable gate arrays (FPGAs). The input ESD protection structure includes a primary ESD protection FET for shunting ESD current from the input pad, and a secondary ESD protection FET, in combination with a series resistor, to limit the voltage appearing across the gate oxides of the input buffer. The primary protection FET is laid out in a multi-finger architecture wherein the drain n$^+$-type conductivity regions are overlapped with a depletion implant. The depletion implant extends from these drain regions, respectively, through channel regions toward the source regions. Further, the ESD protection structure is subject to a p-well mask, which blocks the formation of a p-well to thereby reduce background p-type doping to p-substrate doping levels. The depletion implant and p-well protect mask increase the breakdown, and snapback voltages of the primary and secondary FETs to improve ESD immunity. An n-well is disposed underneath the drain region, particularly under the drain contacts, to increase the junction depth in the drain region to thereby minimize contact spiking during an ESD event. The secondary protection FET is integrated with the primary protection FET by using the same n$^+$diffusions as used by the primary ESD protection FET.

18 Claims, 3 Drawing Sheets

OTHER PUBLICATIONS

EOS/ESD Symposium; "Core Clamps for Low Voltage Technologies"; Dabral, et al.; pp. 94-141 –94-149.

IEEE (1994); "Mixed–Voltage Interface ESD Protection Circuits for Advanced Microprocessors in Shallow Trench and LOCOS Isolation CMOS Technologies"; Voldman, et al.; pp. 94-277 –94-280, Dec. 1994.

EOS/ESD Symposium Proceeding (1990); "Electrostatic Discharge Protection In A 4–MBIT DRAM"; Jaffe, et al.; IBM General Technology Division; pp. 1-6.

IEEE/IRPS (1991); "Proximity Effects of Unused Output Buffers on ESD Performance"; LeBlanc, et al.; Texas Instruments Inc.; pp. 327–330.

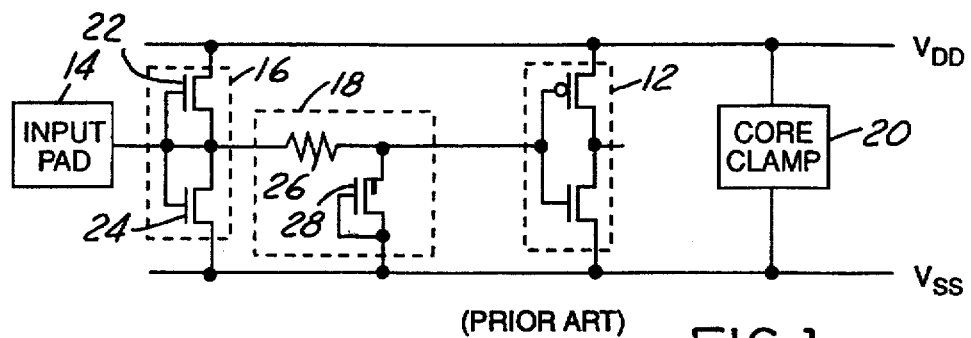
(PRIOR ART) FIG.1
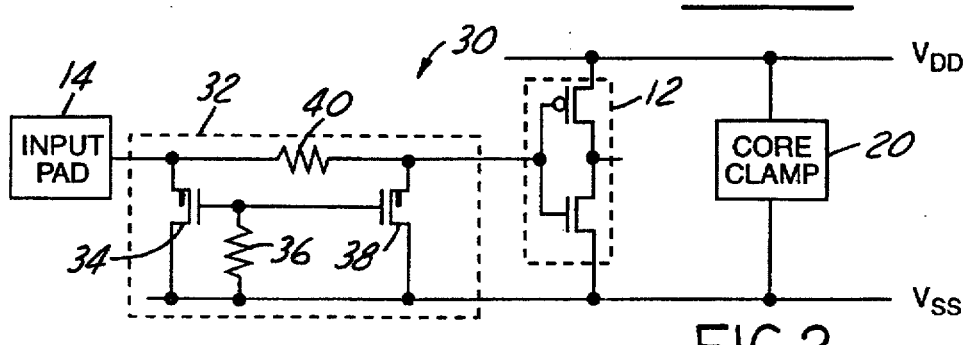
FIG.2
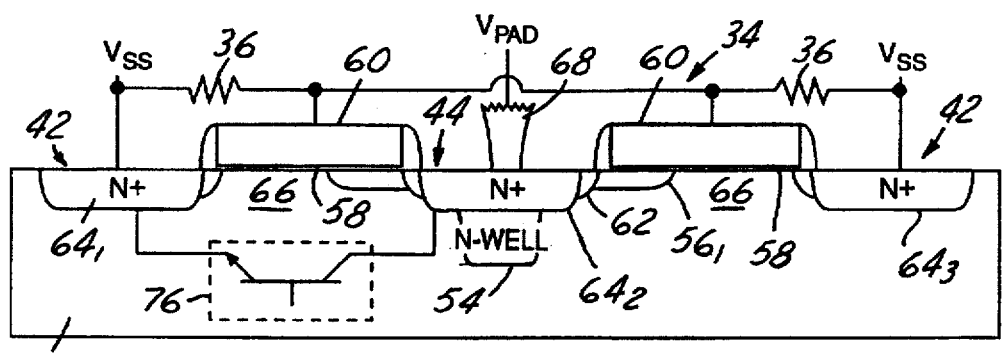
FIG.5
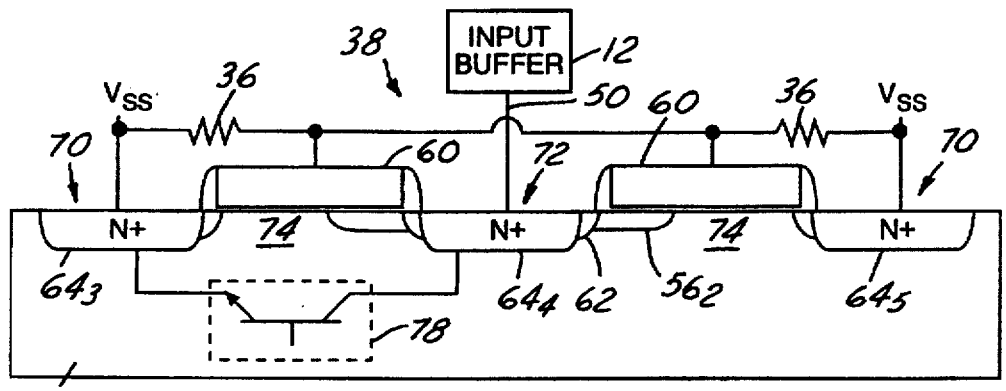
FIG.6

ELECTROSTATIC DISCHARGE (ESD) PROTECTION STRUCTURE FOR HIGH VOLTAGE PINS

BACKGROUND OF THE INVENTION

1. Field of the Invention

The present invention relates generally to protection devices, and, more particularly, to protection devices for protecting integrated circuit devices from electrical transients, including electrostatic discharge (ESD) events on high voltage pins.

2. Description of Related Art

Integrated circuit devices have been subject to ever increasing susceptibility to damage from application of excessive voltages, for example, by electrostatic discharge (ESD) events. This susceptibility is due, in large part, to the ever decreasing gate oxide thicknesses which have resulted as very large scale integration (VLSI) circuit geometries continue to shrink. In particular, during an ESD event, charge is transferred between one or more pins of the integrated circuit device and another conducting object, in a time period that is typically less than one microsecond. This charge transfer can generate voltages that are large enough to break down insulating films (e.g., gate oxides) on the device or can dissipate sufficient energy to cause electro-thermal failures in the device. Such failures include contact spiking, silicon melting, or metal interconnect melting.

Protection circuits are usually connected to all I/O bonding pads of an integrated circuit, to safely dissipate the energy associated with ESD events without causing any damage to the circuitry connected to the I/O pad. Protection circuits may also be connected to power supply pads or between power supply buses to prevent damage to internal circuits.

A particular problem in the art relates to the design of such protection circuits for use in connection with high-voltage input pins, as may be found on programmable integrated circuits, such as programmable logic devices (PLDs), programmable read-only memory (PROMs), or field programmable gate arrays (FPGAs). During programming operations of such devices, a voltage that significantly exceeds the normal operating voltage of the device, for example, a programming voltage $V_{pp}$ in the range of 12–15 volts, is applied to preselected input pins. Since conventional ESD protection structures are designed to safely dissipate high voltages whatever the source on input pins the design requirements of such ESD protection circuits for high-voltage pins become particularly exacting. In particular, a specific problem in the prior art relates to ESD structures that are falsely triggered into operation by application by the above-mentioned programming voltages, with undesirable results.

FIG. 1 is representative of one approach taken in the prior art to protect high-voltage input pins. An input circuit, including ESD protection circuitry, is indicated generally at 10, and is provided for protecting an input buffer 12 from ESD events occurring at input pad 14. Circuit 10 includes a primary ESD protection circuit 16, a secondary ESD protection circuit 18, and a core clamp 20.

Primary ESD protection circuit 16 is provided for shunting ESD charge between input pad 14 and either one of the positive or negative power supply buses $V_{DD}$ or $V_{ss}$, depending on the polarity of the ESD event. Primary ESD protection circuit includes field transistors 22 and 24 provided between input pad 14 and power supply buses $V_{DD}$ and $V_{ss}$. Field transistors 22 and 24 are formed, in part, by the well-known field oxide regions of the semiconductor device acting as gate oxides.

Secondary protection circuit 18 is provided for limiting the voltage across the gate oxides of input buffer 12, and includes a series resistor 26, and a grounded gate "half-depletion" field effect transistor 28 connected in series with resistor 26. Described with greater specificity in the Detailed Description, below, a "half-depletion" FET 28 is a field effect transistor that uses a so-called depletion implant that extends part of the way across the channel of the FET, from the drain end extending towards the source.

In effect, this depletion implant (used primarily to fabricate depletion-mode devices), forms a device in which part of the channel having the depletion implant operates in a depletion-mode, while the remaining part of the channel operates in an enhancement-mode. The amount of charge which flows through ESD protection circuit 18 is rather small in comparison to that which is shunted by primary ESD protection circuit 16 comprised of field transistors 22 and 24.

Core clamp 20, also known as a power supply ESD protection circuit, is placed between power supply buses $V_{DD}$ and $V_{ss}$ to allow charge to be transferred between these power supply buses during an ESD event on input pad 14.

The main disadvantage of the approach shown in FIG. 1 is that the protection structures use a large area, and generally does not fit into the same "footprint" as the input ESD structures for low-voltage applications. Moreover, another disadvantage with the approach shown in FIG. 1 is that field transistor 24 (from pad-to-$V_{ss}$) snaps back to a relatively low-voltage; this relatively low snapback voltage can lead to a destructive failure of the device if field FET 24 is triggered during programming operations.

Accordingly, there is a need to provide an improved ESD protection structure, suitable for use in an integrated circuit, that minimizes or eliminates one or more of the problems as set forth above.

SUMMARY OF THE INVENTION

It is an object of the present invention to provide protection against electrostatic discharge (ESD) on high-voltage input pins on an integrated circuit device. It is a further object of the present invention to provide a protection circuit against ESD on input, output, or input/output pins that permits an efficient and compact layout. It is yet a further object of the present invention to provide a protection circuit against ESD that exhibits an improved breakdown voltage and snapback voltage to thereby improve ESD performance.

To achieve these and other objects, and in accordance with the first aspect of the present invention, an interface structure connected to a pad of a semiconductor device for improved electrostatic discharge (ESD) immunity is provided. The structure includes an interface circuit coupled to the pad and including an n-channel field effect transistor (FET) having source and drain regions of $n^+$-type conductivity, wherein the source and drain regions are spaced apart to define a channel region therebetween. The structure further includes a depletion implant of n-type conductivity overlapping the drain region and extending part way in the channel towards the source region. The drain region of the n-channel FET is directly connected to the pad. Use of the depletion implant increases the breakdown voltage and snapback voltage of the inventive interface structure. Moreover, the invention may be adapted for use on any n-channel FET directly connected to an input, output, or input/output (I/O) pin of an integrated circuit that is required to withstand high-voltage. Thus, although the so-called "half depletion" implant has been used in the prior art in secondary ESD protection circuits (e.g., see FIG. 1), such conventional uses have required an in-series resistance to limit current therethrough.

In a preferred embodiment, the inventive interface structure is adapted to be connected to an input pad of a semiconductor device for protecting an input buffer, and includes a partial-depletion implanted grounded-gate FET as the primary protection device for ESD and secondary ESD protection means. The primary protection is provided by a primary field effect transistor (FET) having spaced source and drain regions to define a first channel region therebetween. The primary FET includes a depletion implant overlapping the drain region and partially extending in the first channel towards the source region. The drain is connected to the input pad, and the source is connected to a negative power supply bus $V_{ss}$. A gate electrode of the primary FET is coupled to $V_{ss}$ (through a resistor, preferably). The secondary ESD protection means is connected to the input pad for clamping a voltage potential to the input buffer to a predetermined level. The snapback voltage of a constructed version of the preferred embodiment was observed to be approximately 12.5 volts, in comparison to 9.3 volts with the approach taken in the prior art. The higher snapback voltage for an embodiment in accordance with the present invention makes the device less susceptible to programming failures due to undesired triggering of the ESD structure into snapback during programming operations. As an enhancement to the above-described preferred embodiment of the present invention, an n-well is provided under drain contacts, which helps to prevent contact spiking during an ESD event by increasing the depth of the junction under the contacts, thereby increasing the distance that a spike would have to propagate in order to short out the junction.

In another aspect of the present invention, an ESD protection device connected to a high-voltage input pad of a semiconductor device for protecting an input buffer having an improved layout is provided. The protection device includes a primary FET having interdigitated source and drain regions formed by corresponding interdigitated $n^+$-type conductivity regions to define a plurality of channel regions. The protection device also includes a secondary FET having a source region and a drain region to define a channel region; the source and drain of the secondary FET are formed by sharing $n^+$-type conductivity regions with the primary FET. The device further includes a series, secondary protection resistor disposed between drain regions of the primary and secondary FETs. This resistor is formed in one of the interdigitated $n^+$-type conductivity regions. The gate electrodes of the primary and secondary FETs are coupled to the negative power supply bus $V_{ss}$ through a grounding resistor formed through a laterally furthermost $n^+$-type conductivity region corresponding to a source region of the primary and secondary FETs. Thus, the secondary ESD protection circuit and gate grounding resistor are integrated with the primary FET. An embodiment in accordance with this aspect of the present invention is smaller than conventional structures by approximately thirteen percent (13%), which translates directly into a reduced die cost, and hence a more competitive product. Furthermore, the reduced area also fits into the same "footprint" as comparable low-voltage input ESD structures, which further simplifies die layout, and may lead to further area savings.

Other objects, features, and advantages of the present invention will become apparent to one skilled in the art from the following detailed description and accompanying drawings illustrating features of this invention by way of example, but not by way of limitation.

BRIEF DESCRIPTION OF THE DRAWINGS

FIG. 1 is a simplified, combined schematic and block diagram view of protection circuitry employed in the prior art in connection with an input pad of semiconductor device.

FIG. 2 is a simplified, combined schematic and block diagram view of an input ESD protection device embodiment of the present invention.

FIG. 5 is a simplified, exaggerated cross-sectional view of a semiconductor structure taken substantially along lines 5—5 of FIG. 4, illustrating a primary ESD protection field effect transistor structure.

FIG. 6 is a simplified, exaggerated cross-sectional view of a semiconductor structure taken substantially along lines 6—6 of FIG. 4, illustrating a secondary ESD protection field effect transistor in accordance with the present invention.

DETAILED DESCRIPTION OF THE PREFERRED EMBODIMENTS

Figure 3:
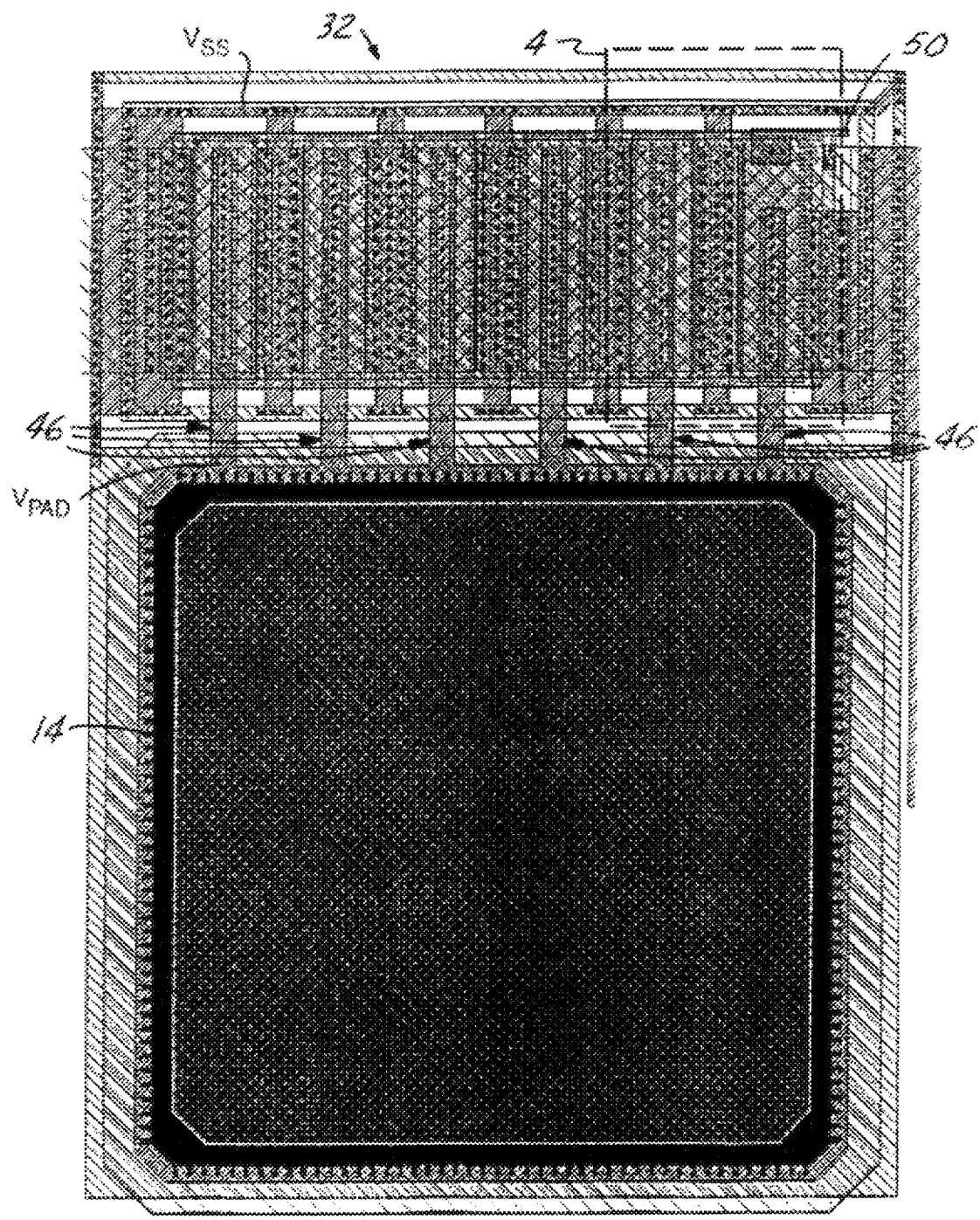
FIG. 3 is a fabrication, top layout view corresponding to the embodiment shown in FIG. 2, particularly showing an input pad, and associated ESD protection circuitry.

Referring now to the drawings wherein like reference numerals are used to identify identical components in the various views, FIG. 2 shows an interface structure, such as input structure 30, in which the present invention may be advantageously employed. Structure 30 includes input buffer 12, input pad 14, core clamp 20, and electrostatic discharge (ESD) protection circuit 32. Buffer 12, pad 14, and core clamp 20 have been discussed previously in the Background section.

Protection circuit 32 provides the functions of the primary ESD protection, and secondary ESD protection circuits discussed above in connection with the prior art structure 10; namely, shunting ESD charge between input pad 14 and either power supply bus $V_{DD}$ or $V_{ss}$, depending on the polarity of the EBD event, and, second, to clamp or limit the voltage which appears across the gate oxide of input buffer 12. Circuit 32 includes a partial depletion-implant type primary field effect transistor (FBT) 34, grounding resistor 36, partial depletion-implant type secondary FET 38, and series resistor 40.

Referring now to FIG. 3, a top, fabrication layout view of structure 30 is shown, with EBD protection circuit 32 illustrated particularly in the top portion of the Figure being connected to input pad 14 shown generally in the lower portion of the Figure. FET 34 occupies most of the die area consumed by ESD protection circuit 32; this is because FET 34 must shunt large currents (e.g., approximately 2.6 amperes for a 4,000 volt ESD zap). FET 34, shown schematically as a single device in FIG. 3, is, in actuality, a plurality of FBTs in parallel. In particular, FET 34 includes interdigitated source regions 42, and drain regions 44, formed by corresponding interdigitated $n^+$-type conductivity regions. One such pair of source and drain regions are specifically indicated at 42, and 44 in FIG. 3 (the remainder of the reference numerals being omitted for clarity).

The drain regions 44 are connected to input pad 14 by way of metal layers 46. The source regions 42 are connected to a negative power supply bus $V_{ss}$ by way of metal layers 48. It should be appreciated that other conductive materials may be used for connections 46, and 48. Drain regions 44 are electrically connected to metal layers 46, and thus input pad 14, by a plurality of contact regions. To correlate FIG. 3 with FIG. 2, it should be noted that connection 50 of FIG. 3 corresponds to the connection between EBD protection circuit 32 and input buffer 12.

Figure 4:
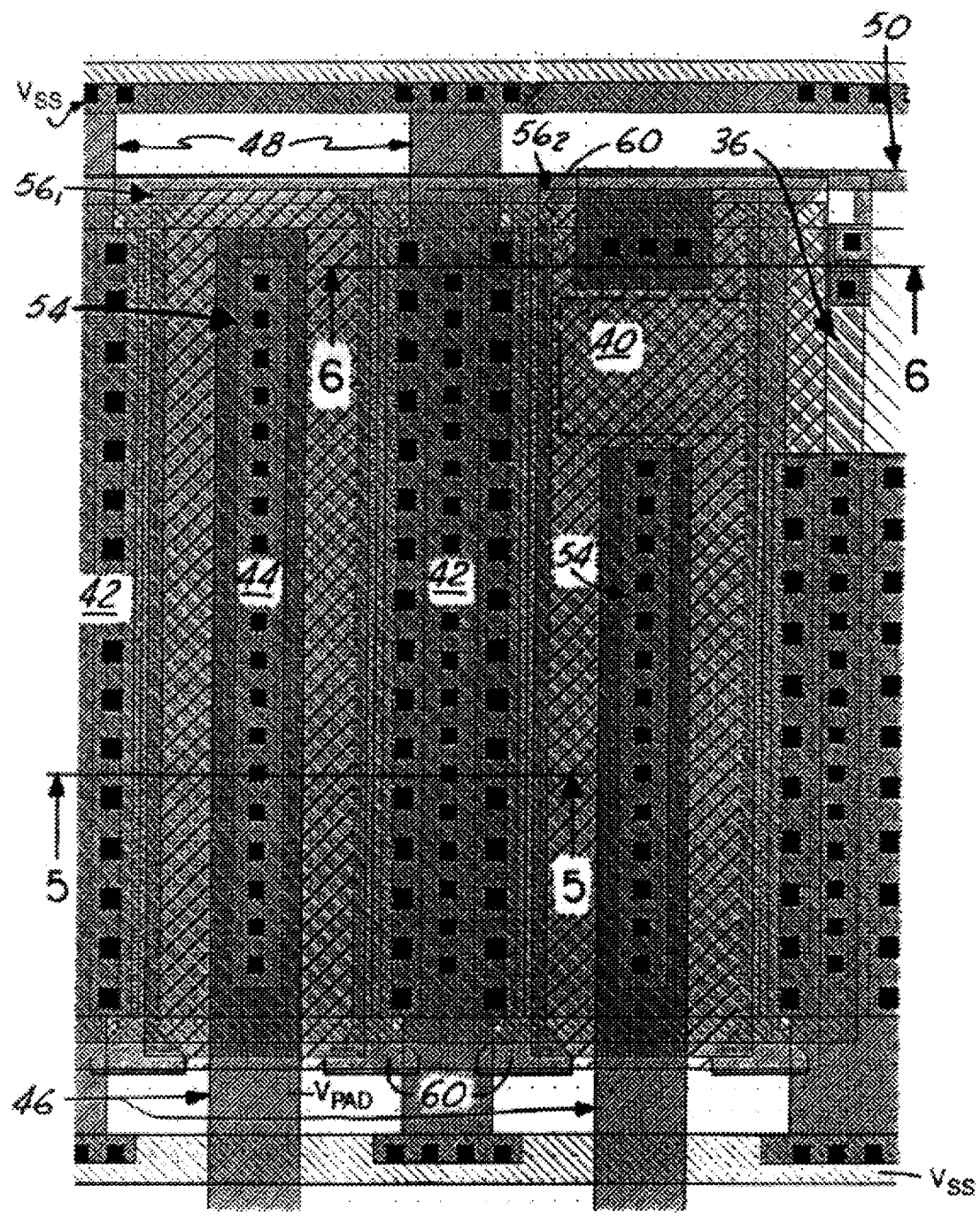
FIG. 4 is a fabrication, top layout view corresponding substantially to the enclosed feature indicated generally at 4 as shown in FIG. 3, showing in greater detail a preferred embodiment shown schematically in FIG. 2.

FIG. 4 shows in greater detail the feature enclosed in phantom line indicated at 4 in FIG. 3. FIG. 4 is a top, fabrication layout view, showing in particular where the cross-section views of FIGS. 5, and 6 are taken, and will be referred to from time-to-time to more clearly illustrate features of the present invention.

FIG. 5 is a cross-sectional view of one of the "fingers" of primary ESD protection FET 34, taken substantially along lines 5—5 of FIG. 4. FET 34 includes substrate 52, well 54, depletion implant 55, gate dielectric 58, gate electrode 60, lightly doped drain (LDD) region 62, highly doped regions such as $n^+$-type conductivity regions $64_i$, channels 66, and contacts 68.

Before proceeding to a description of the operation of circuit 32, a detailed description of the fabrication of circuit 32 with reference to the accompanying drawings will be set forth. Substrate 52 is preferably lightly doped p-type conductivity, and has a relatively low conductivity therefor. In the preferred embodiment, substrate 52 is doped in the range of $2.0–3.0\times10^{14}$ atoms/cm$^3$, and is preferably doped in an average concentration of $2.5\times1014$ atoms/cm$^3$.

Next, well region 54 is formed in substrate 52 and is of a conductivity type opposite that of the substrate, preferably n-type. N-well 54 may have an impurity concentration in the range of $2.5–3.5\times10^{16}$ atoms/cm$^3$ and is $3.0\times10^{16}$ atoms/cm$^3$ in the preferred embodiment. N-well 54 underlies drain region 44, and in particular underlies the region of $n^+$-type conductivity region 64 under contact 68 to thereby reduce contact spiking during ESD events on input pad 14. N-well 54 accomplishes this object by increasing the depth of the junction under the contacts to thereby increase the distance that a spike would have propagate in order to short out the junction itself. Fabrication techniques for such well regions are well-known, and within the expertise of one of ordinary skill in the art.

Next, the area in which ESD protection circuit 32 is fabricated is masked by a p-well protect mask to inhibit formation of a p-well implant in the area of circuit 32. In a conventional CMOS process, n-channel devices are frequently fabricated in a p-well, which has a higher impurity concentration (i.e., in the range of $2.5–3.5\times10^{16}$ atoms/cm$^3$), than the background p-type impurity concentration of substrate 52. Although the increased p-type impurity concentration associated with a p-well may be desirable for obtaining certain predetermined operating characteristics of n-channel devices fabricated therein, in accordance with the present invention, the lower, background p-type impurity concentration associated with the p-type substrate 52 is preferred since such grading across the $n^+$/p junction in drain region 44 leads to an improved (increased) breakdown voltage.

Next, a depletion implant 56 is formed in substrate 52 of a conductivity type opposite that of substrate 52, preferably n-type. The concentration of this implant may be in the range of $5.0–7.0\times10^{17}$ atoms/cm$^3$ and is $6.0\times10^{17}$ atoms/cm$^3$ in the preferred embodiment. The depletion implant 56 is formed generally in drain regions 44 of FET 34, and as shown in FIG. 5, particularly overlaps $n^+$-type conductivity region $64_2$ and extends in channel regions 65 towards source regions 42 (formed by $n^+$-type conductivity regions $64_1$, and $64_3$, as shown in FIG. 5). Although the device of this type is sometimes referred to herein as a "half-depletion" device, the depletion implant does not literally extend "half-way" across channel 66, but rather, in the preferred embodiment, is closer to extending approximately ⅓ of the channel length into the channel towards the source. Particularly, the depletion implant extends 0.6 μm into the channel, which in this case is 1.8 μm wide. However, as the channel width varies, the "⅓" ratio mentioned above, would, of course, also change. The depletion implant 56 is accomplished by using a conventional CMOS process in which areas that are not to receive the implant are masked, and arsenic (particularly species AS+75), is implanted in a predetermined dose and energy, preferably $5.5\times10^{12}$ per cm$^2$ and 160 Key, respectively. The depletion implant is done prior to growth of gate oxide 58. Note, particularly, that the depletion implant is not self-aligned to gate electrodes 60.

Next, gate oxides 58 are grown by conventional methods to a predetermined thickness that may be a function of the particular application selected to obtain desired results.

Next, gate electrodes 60 are formed of a conductive material. In the preferred embodiment, gate electrodes 60 are made of polycrystalline silicon ("poly") doped to obtain the predetermined sheet resistance, depending upon the particular application. This part of the structure in accordance with the present invention is conventional.

Next, LDD (lightly-doped drain) 62 is made in accordance with well-known and conventional CMOS processes using gate electrodes 60 as a mask.

Highly-doped conductivity region $64_i$, are formed in substrate 52 of a conductivity type opposite substrate 52, and preferably n-type. These regions are generally parallel and have been designated with a subscript 1, 2, 3, . . . 5 for distinguishing them to more clearly describe the present invention. Complete formation of source regions 42, and drain regions 44, being spaced apart, thereby define channel regions 66 therebetween. Finally, contact cuts are made for forming contacts 68 to connect drain region 44, with metal layer 46 (and thus to input pad 14) by way of the plurality of contacts 68. These contacts 68 are conventional.

Referring now to FIGS. 4 and 5, and particularly FIG. 4, gate electrodes 60 are coupled to negative power supply bus $V_{ss}$ through grounding resistor 36. Resistor 36, as clearly shown in FIG. 4, is formed through a laterally furthermost $n^+$-type conductivity region 645, which corresponds to the source region of primary ESD protection FET 34 to thereby define a diffusion resistor 36. Resistor 36 is used to allow the gates of FET 34 and 38 (best shown in FIG. 2) to rise above the negative power supply bus $V_{ss}$ during the initial ramp of the ESD pulse, and reduce the trigger voltage of FET 34 during the ESD event. That is, and referring now to FIG. 5 particularly, capacitive coupling between the drain region 44 and the gate electrodes 60 causes current to flow through resistor 36 to negative power supply bus $V_{ss}$, which thereby raises the gate voltage slightly above $V_{ss}$. The small positive gate-to-source voltage permits FET 34 to turn-on at a lower voltage during the ESD event. The value of resistor 36 must be selected to insure that it does not reduce the breakdown voltage to an undesirable level during transients which can occur during normal operations, including programming operations. The resistance value of resistor 36 for the preferred embodiment is approximately 120 ohms, with a ±15% variation. It should be appreciated that this change in trigger voltage does not also lower the holding voltage during snapback mode under normal operating conditions.

An important feature of the present invention relates to the high degree of integration of the secondary ESD protection (i.e., the clamping or voltage limiting function to protect gate oxides of input buffer 12) with the primary ESD protection (i.e., current shunting function). Referring now to FIG. 4, and in accordance with the present invention, the secondary ESD protection function, performed by secondary FET 38, and series resistor 40 (together forming secondary ESD protection means), are integrated into the interdigitated structure of the primary FET 34. In particularly, secondary FET 38, and resistor 40 are formed about the $n^+$-type conductivity region 64, particularly region $64_4$, corresponding to the laterally furthermost drain region of primary FET 34.

FIG. 6 is a simplified, exaggerated cross-sectional view of secondary FET 38 taken substantially along line 6—6 of FIG. 4. FET 38 includes source region and drain region 12, spaced apart, to define channel region Source 10 and drain 12 are formed using the $n^+$-type conductivity regions used by primary FET 34. FET 38 is similar in structure to FET 34, but does not include an n-well 54 formed underneath its drain. No n-well is required since drain 12 is electrically connected to the gates of input buffer 12, not the input pad 14, where high voltage/high current can occur due to ESD events. In effect, secondary FET 38, shares certain $n^+$-type conductivity regions 64, with primary FET 34, to thereby provide a significantly more compact lay out and efficient utilization of die area.

Series resistor 40 is formed generally in the region indicated at 40, as shown in FIG. 4. Resistor 40 is disposed generally in the drain region between the drain connections of primary FET 34 (to input pad 14), and FET 38 (to input buffer 12). Series resistor 40 may have a resistance value, in the preferred embodiment of approximately 75 ohms, with a ±15% variation.

Referring now to FIGS. 5 and 6, during normal operation, partial depletion primary FET 34 is in a non-conductive or "off" state when its gate electrode is held at a ground potential, since the threshold voltage is controlled by the source end of channel 66, and that end of the channel does not contain any depletion implant. Depletion implant $56_i$ increases the breakdown voltage of the $n^+$drain/p substrate junction by reducing the lateral electric field in the channel region 66 near drain 44. The above-mentioned p-well protect mask further increases the breakdown voltage of FET 34 by reducing the background of p-type doping of the material that is below the $n^+$drain junction and channel 66.

For a positive polarity ESD zap, the voltage on the $n^+$drain junction 44 of FET 34 will increase until the junction breaks down, which has been observed in a constructed embodiment of the present invention to occur at approximately 16.8 volts. This breakdown injects holes into substrate 52, and causes FET 34 to "snapback". In the snapback mode, FET 34 operates as a lateral NPN bipolar transistor, shown schematically as NPN transistor 76 in FIG. 5, with the base current being supplied by holes generated by impact ionization at the drain end of channel 66. The voltage between $n^+$drain junction 44, and $n^+$ source 42 in snapback mode (i.e., the so-called snapback voltage $V_{sb}$) falls from the observed 16.8 volts to approximately 12.5 volts for the constructed embodiments, for low current levels. The ESD charge appearing at input pad 14 is shunted from input pad 14 to the negative power supply bus $V_{ss}$ through primary protection FET 34 in snapback. The ESD charge can then be transferred from the $V_{ss}$ bus to the $V_{DD}$ bus through core clamp 20 if the ESD zap is referenced to the $V_{DD}$ bus.

As referred to above, the current that flows through primary BSD protection FET 34 can be quite large (e.g., approximately 2.6 amperes for a 4,000 volt ESD zap), during an ESD event. Because of the high current levels, the voltage across FET 34 used for the primary protection will increase above the particular snapback voltage measured at low current levels. This increase is due to the resistance associated with the electron-hole plasma which forms in the channel region 66 during snapback, as well as the parasitic resistance of source-drain diffusions and interconnects. Secondary ESD protection means formed by secondary FET 38, and series resistor 40, clamps the voltage at input buffer 12 to the low-current level of snapback voltage by limiting the current by using series resistor 40. N-well 54, which is disposed to wholly underlie drain region 44 under contacts 68, helps to prevent contact spiking during the ESD event by increasing the depth of the junction under the contacts 68, to thereby increase the distance that a spike would have to propagate in order to short out the junction.

Capacitive coupling between drain 44 and gate electrode 60 by way of depletion implant 56, raises the gate voltage slightly above ground potential. This small positive gate-to-source voltage allows FET 34 to turn-on at a lower voltage during the ESD event and thereby improve ESD immunity.

For a negative polarity ESD zap, the operation of ESD protection circuit 32 is similar to the description provided above regarding a positive ESD zap, except, that the snapback voltage of the partial depletion FET 34 is smaller, primarily because there is no depletion implant 56 at the source end of channel 66. In addition, the parasitic diode formed by the P-substrate 52, and $n^+$drain diffusion 64 carries some of the ESD current. As a result of this diode component, and, the lack of a depletion implant 56 at the source end of channel 66, ESD protection circuit 32 work slightly more effectively for a negative polarity zap.

A constructed version of the preferred embodiment was made in which the total gate width of the multi-finer primary ESD protection FET 34 was approximately 431 μm, and in which a gate length was approximately 1.8 μm, and in which the depletion implant extended into channel region 66 by approximately 0.6 μm from the drain edge of the gate, which had an observed snapback voltage of approximately 12.5 volts, as compared to approximately 9.3 volts for the prior art structure 10 as shown in FIG. 1. This higher snapback voltage of an embodiment in accordance with the present invention makes the device less acceptable to programming failures due to undesired triggering of the ESD protection structure in the snapback. In particular, ESD testing of this constructed embodiment, using the human body model (HBM) showed that the embodiment passes 4,800 volts, which is comparable to the prior art structure 10 but, which as mentioned above, displays an improved breakdown voltage, an improved snapback voltage, and a reduced area, by approximately 13%.

While the invention has been particularly shown and described with reference to the preferred embodiments thereof, it is well understood by those skilled in the art that various changes and modifications can be made in the invention without departing from the spirit and scope of the invention. In particular, the present invention may be adapted for use on any n-channel FET connected to an output pad, or input/output (I/O) pad as well the input pads, which are required to withstand high voltage. In particular, the present invention, when adapted for use on output or I/O pins would modify the output driver FETs to include the "half-depletion" FET structure described above in connection with input ESD protection circuit 32. This adaptation of the present invention would allow high voltages to be applied to all n-channel FETs used in the output driver (e.g., an n-channel pull down device) connected to the pad.

I claim:

1. An interface structure connected to a pad of a semiconductor device for improved electrostatic discharge (ESD) immunity, comprising:

an output driver coupled to said pad and including an n-channel field effect transistor (FET) having a source region and drain region of $n^+$-type conductivity, said source and drain regions being spaced to define a channel region therebetween said drain region being directly connected to said pad by a plurality of contact regions;

a depletion implant of n-type conductivity overlapping said drain region and extending in said channel region towards said source region; and an n-well underlying said drain region to thereby reduce contact spiking during ESD events on said pad.

2. An interface structure for improved electrostatic discharge (ESD) immunity, comprising:

an interface circuit including an n-channel field effect transistor (FET) having source and drain regions of $n^+$-type conductivity, said source and drain regions being spaced to define a channel region therebetween, and said drain region being connected to a pad of a semiconductor device by a plurality of contact regions;

a depletion implant of n-type conductivity overlapping said drain region and extending said channel region towards said source region; and an input buffer wherein said interface circuit comprises an ESD protection circuit coupled between said pad and said input buffer for protecting said input buffer from ESD events occurring on said pad, said source being connected to a negative power supply bus ($V_{ss}$), said n-channel FET further having a gate electrode coupled to said negative power supply bus ($V_{ss}$), said n-channel FET defining a primary protection device.

3. The interface structure of claim 2, wherein said interface circuit is an out put driver, said n-channel FET defining a pulldown device.

4. The interface structure of claim 2 wherein said protection circuit further includes an n-well underlying said drain region to thereby reduce contact spiking during ESD events on said pad.

5. The interface structure of claim 2 wherein said ESD protection circuit further includes a first resistor disposed between said pad and said input buffer, and another n-channel FET defining a secondary protection device having a drain region connected to said input buffer, a source region connected to said negative power supply bus ($V_{ss}$) and a gate electrode connected to said gate electrode of said primary protection device.

6. The interface structure of claim 5 wherein said gate electrode of said primary protection device is coupled to said negative power supply bus ($V_{ss}$) through a second resistor.

7. An electrostatic discharge (ESD) protection structure connected to an input pad of a semiconductor device for protecting an input buffer, comprising:

a primary field effect transistor (FET) having spaced source and drain regions to define a first channel region therebetween, said primary FET having a depletion implant overlying said drain region and extending in said first channel towards said source for improving breakdown and snapback voltage levels, said drain region being connected to said input pad, said source region being connected to a negative power supply bus ($V_{ss}$), said primary FET further having a gate electrode coupled to said negative power supply bus ($V_{ss}$), and a secondary ESD protection means connected to said pad for clamping voltage potential to said input buffer to a predetermined level.

8. The structure of claim 7 wherein said gate electrode is coupled to said negative power supply bus ($V_{ss}$) through a resistance.

9. The structure of claim 7 wherein said pad is connected to said drain region through a plurality of contact regions, said structure further including an well underlying said drain region under said plurality of contacts for reducing contact spiking during ESD events on said pad.

10. The structure of claim 7 wherein said secondary ESD protection means includes a resistor connected between said pad and said input buffer, and a secondary FET having a gate electrode, and drain and source regions spaced apart to define a second channel region therebetween, said drain region being coupled to said input buffer, said source region being coupled to said negative power supply bus ($V_{ss}$), said secondary FET having said depletion implant, said gate electrode of said secondary FET being connected to said gate electrode of said primary FET.

11. A structure for protecting an input buffer of a semiconductor device from electrostatic discharge (ESD) events occurring on an input pad, comprising:

a semiconductor substrate of a first conductivity type;

a source region formed in said substrate of a second conductivity type opposite said first conductivity type;

a drain region formed in said substrate of said second conductivity type, said source region and said drain region being spaced apart to define a channel region therebetween, said drain region being connected to said pad by a plurality of contact regions;

a depletion implant region formed in said substrate of said second conductivity type, said depletion implant being formed in said drain region and extending in said channel region toward said source region;

a well region formed in said substrate of said second conductivity type, said well region underlying said drain region under said contact regions to thereby reduce contact spiking during ESD event on said pad.

12. The structure of claim 11 wherein said first conductivity type is p-type and said second conductivity type is n-type.

13. The structure of claim 11 wherein said channel has associated therewith a channel length, and wherein said depletion implant extends less than half said channel length towards said source region.

14. The structure of claim 11 said well region wholly underlies said drain region.

15. The structure of claim 11 wherein a portion of said substrate below said drain region in said substrate has an impurity concentration less than $10^{16}$ atoms/cc.

16. An electrostatic discharge (ESD) protection device connected to a high voltage input pad of a semiconductor device for protecting an input buffer having an improved layout, comprising:

a primary field effect transistor (FET) having interdigitated source and drain regions formed by corresponding interdigitated $n^+$-type conductivity regions to define a plurality of channel regions, said drain regions of said primary FET being connected to said input pad a secondary FET having a source region and a drain region to define a channel region therebetween, said secondary FET sharing $n^+$-type conductivity regions with said primary FET;

a first resistor disposed between drain regions of said primary FET and said secondary FET, said first resistor being formed in one of said interdigitated n⁺-type conductivity regions and, a depletion implant overlapping n⁺-type conductivity regions corresponding to said drain regions of said primary FET and said secondary FET and extending through said channel regions toward said source regions of said primary FET and said secondary FET;

wherein said primary FET and said secondary FET includes respective gate electrodes formed over said respective channel regions, said gate electrodes being coupled to a negative power supply bus ($V_{ss}$).

17. The device of claim 16 further including a well of n-type conductivity underlying said drain regions of said primary FET.

18. The device of claim 16 wherein said gate electrodes are coupled to said negative power supply bus ($V_{ss}$) through a second resistor, said second resistor being formed through a laterally furthermost n⁺-type conductivity region corresponding to said source region of said primary and secondary FET.

* * * * *